United States Patent
Zhang et al.

(10) Patent No.: US 10,763,888 B1
(45) Date of Patent: Sep. 1, 2020

(54) METASTABILITY SHAPING TECHNIQUE FOR CONTINUOUS-TIME SIGMA-DELTA ANALOG-TO-DIGITAL CONVERTERS

(71) Applicant: NXP B.V., Eindhoven (NL)

(72) Inventors: Chenming Zhang, Eindhoven (NL); Lucien Johannes Breems, Waalre (NL); Muhammed Bolatkale, Rijswijk (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/407,501

(22) Filed: May 9, 2019

(51) Int. Cl.
*H03M 3/00* (2006.01)
*H03M 1/08* (2006.01)
*H03M 1/12* (2006.01)

(52) U.S. Cl.
CPC .......... *H03M 3/454* (2013.01); *H03M 1/0863* (2013.01); *H03M 1/12* (2013.01); *H03M 3/352* (2013.01); *H03M 3/412* (2013.01)

(58) Field of Classification Search
CPC ...... H03M 3/454; H03M 3/352; H03M 3/412; H03M 1/12; H03M 1/0863
USPC .................................................. 341/118–143
See application file for complete search history.

(56) References Cited

U.S. PATENT DOCUMENTS

| | | | |
|---|---|---|---|
| 6,836,228 B1* | 12/2004 | Levinson | H03M 3/348 341/136 |
| 7,173,980 B2* | 2/2007 | Masenten | H03M 3/3287 375/316 |
| 9,143,158 B2 | 9/2015 | Breems | |
| 9,742,428 B2* | 8/2017 | Choi | H03M 3/422 |
| 2005/0143032 A1* | 6/2005 | Matsushita | H03D 3/008 455/232.1 |
| 2008/0291069 A1* | 11/2008 | Inukai | H03M 3/32 341/143 |
| 2010/0295715 A1* | 11/2010 | Sornin | H03M 3/372 341/143 |
| 2012/0062405 A1* | 3/2012 | Loeda | H03M 3/37 341/143 |
| 2015/0280732 A1* | 10/2015 | Beaulaton | H03M 3/404 341/143 |
| 2015/0280734 A1* | 10/2015 | Si | H03M 3/464 341/143 |
| 2016/0197620 A1* | 7/2016 | Gore | H03M 3/35 324/207.15 |

(Continued)

FOREIGN PATENT DOCUMENTS

EP 3340475 A1 6/2018

OTHER PUBLICATIONS

Bolatkale, Muhammed et al., "A 4 GHz Continuous-Time Delta-Sigma ADC with 70 dB DR and -74 dBFS THD in 125 MHz BW", IEEE Journal of Solid-State Circuits, vol. 46, No. 12, Dec. 2011, pp. 2857-2868.

(Continued)

*Primary Examiner* — Lam T Mai

(57) ABSTRACT

A method includes using a first feedback loop to compensate for a first excess loop delay (ELD) associated with a first quantizer and a first DAC of the first feedback loop. The first quantizer provides a first quantizer output to a second feedback loop. A second feedback loop compensates for a second ELD associated a second quantizer and a second DAC of the second feedback loop. The second quantizer reduces a metastability error associated with the first quantizer output.

20 Claims, 8 Drawing Sheets

(56) References Cited

U.S. PATENT DOCUMENTS

2018/0109268 A1* 4/2018 Kong ................. H03H 17/02
2018/0183459 A1* 6/2018 Breems ............... H03M 3/352
2019/0245553 A1* 8/2019 Bolatkale ............ H03M 3/424

OTHER PUBLICATIONS

Cherry, James A. et al., "Clock Jitter and Quantizer Metastability in Continuous-Time Delta-Sigma Modulators", IEEE Transactions on Circuits and Systems—II: Analog and Digital Signal Processing, vol. 46, No. 6, Jun. 1999, pp. 661-676.

Cherry, James A. et al., "Excess Loop Delay in Continuous-Time Delta-Sigma Modulators", IEEE Transactions on Circuits and Systems—II: Analog and Digital Signal Processing, vol. 46, No. 4; Apr. 1999, pp. 376-389.

Loeda, Sebastian et al., "A 10/20/30/40 MHz Feedforward FIR DAC Continuous-Time Delta-Sigma ADC With Robust Blocker Performance for Radio Receivers", IEEE Journal of Solid-State Circuits, vol. 51, No. 4, Apr. 2016, pp. 860-870.

\* cited by examiner

METASTABILITY SHAPING TECHNIQUE FOR CONTINUOUS-TIME SIGMA-DELTA ANALOG-TO-DIGITAL CONVERTERS

BACKGROUND

Sigma-delta analog-to-digital converters (ADCs) are used in modern data processors to generate high-speed data. Metastability error is a type of error that occurs at the output of a sigma-delta ADC when the voltage output of a quantizer that is used to convert the analog signal to a digital signal is not at the ideal voltage output expected by the data processor. Not addressing the detrimental effects of metastability error may result in a data processor that is inaccurate. Thus, there exists a need to provide corrective techniques that address the effects of metastability error in a data processor.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1A:
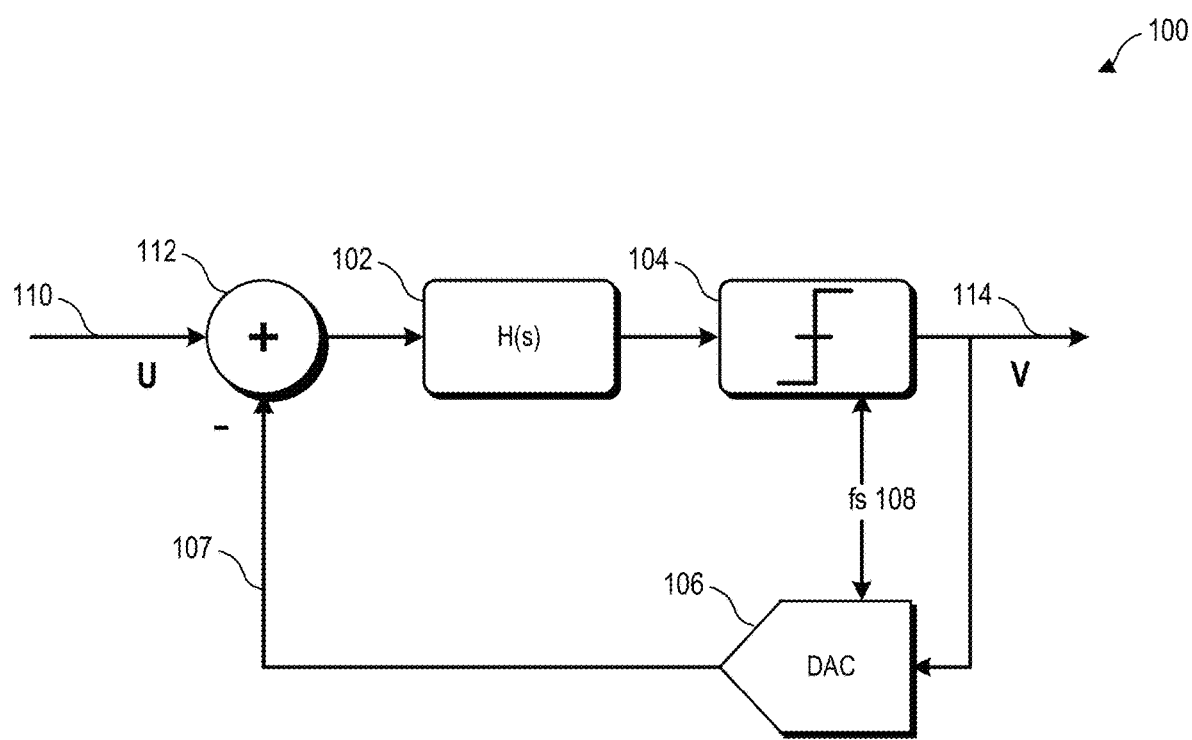
FIG. 1A is a schematic block diagram of a sigma-delta modulator.
Figure 1B:
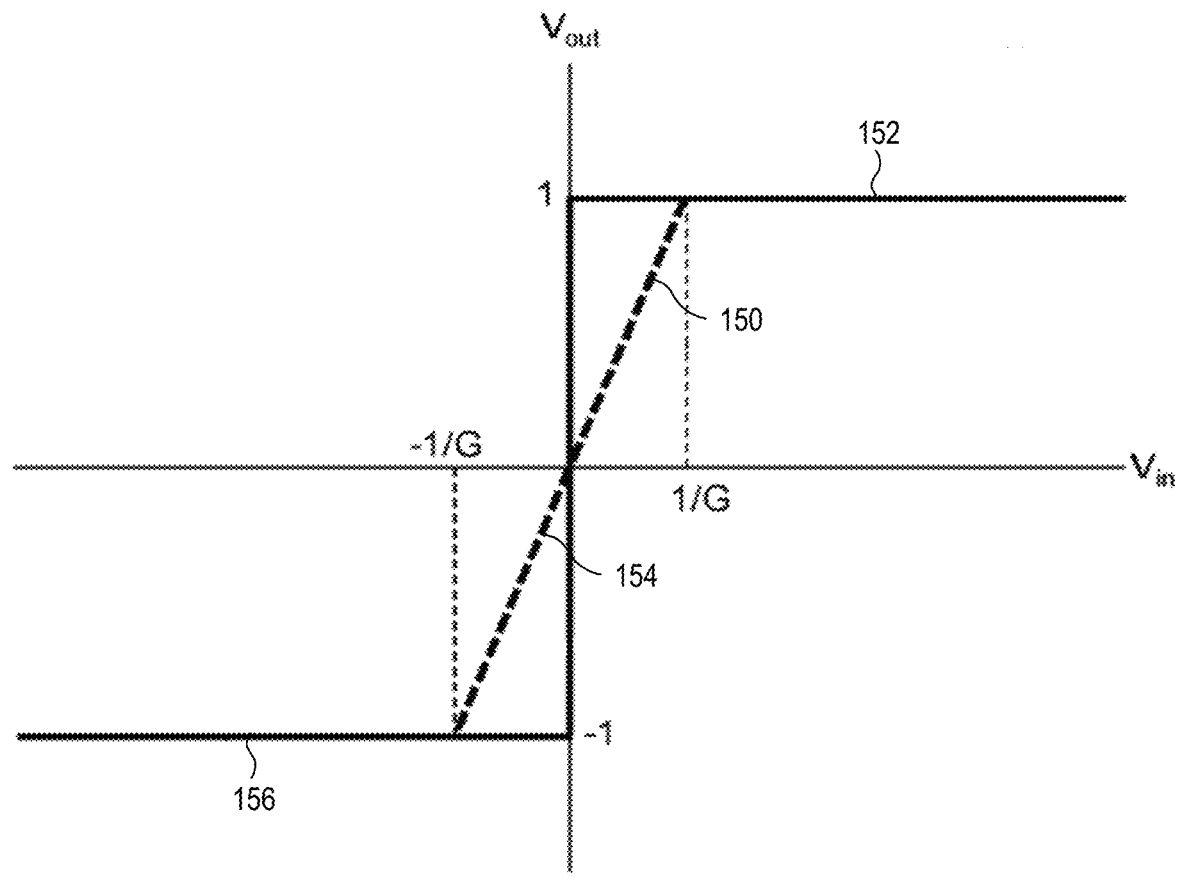
FIG. 1B is an output characteristic of the 1-bit quantizer of FIG. 1A with a limited regeneration time.
Figure 2:
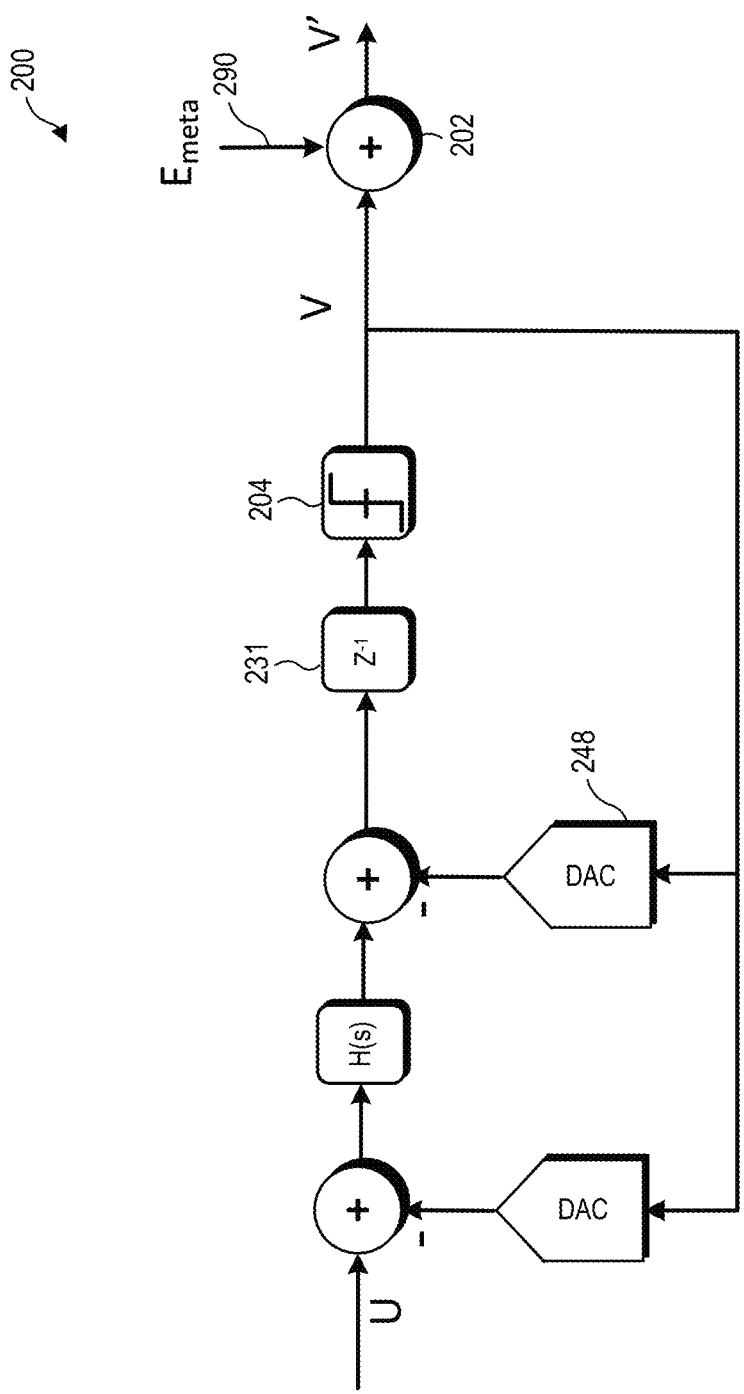
FIG. 2 illustrates a schematic block diagram of a data processor with metastability error.

FIGS. 1A, 1B, and 2 illustrate sigma-delta modulators and a corresponding output characteristic of a 1-bit quantizer with a limited regeneration time that operate as the basis of continuous-time sigma-delta modulators depicted in FIGS. 3-8. FIGS. 3-8 illustrate systems and techniques that are used to reduce metastability error in a continuous-time sigma-delta analog-to-digital converter (ADC) of a data processor. A dual-feedback technique is used in combination with dual quantization to reduce the metastability error of the data processor and address the delay that occurs in each feedback loop of the dual-feedback system. The dual-feedback technique includes a pair of digital-to-analog converters (DAC) that are configured to compensate for the delay in a quantizer of each feedback loop of the data processor. By applying the metastability error compensation technique using dual-quantization and compensating for the delay of the additional quantizers using the DACs associated with each feedback loop, the data processor is able to reduce the amount of metastability error that occurs at the output of the data processor.

FIG. 1A illustrates a block diagram of a sigma-delta modulator 100. The sigma-delta modulator 100 is an example of a data processor with a feedback system. The sigma-delta modulator 100 includes an adder 112, a loop filter (H(s)) 102, a quantizer or analog-to-digital converter (ADC) 104, and a digital-to-analog converter (DAC) 106. The DAC 106 provides a feedback path to adder 112 that is coupled to receive an analog input and the output of the DAC 106.

An input U 110 is coupled to a positive input of the adder 112. The output of the adder 112 is coupled to an input of the loop filter 102. The output of the loop filter 102 is coupled to an input of the quantizer 104. An output of the quantizer 104 is the output V 114 of the sigma-delta modulator 100. In order to provide the feedback loop, the output of the quantizer 104 is also coupled to an input of the DAC 106. The output of the DAC 106 is coupled to a negative input of the adder 112 to provide a feedback signal 107. In this way, the DAC 106 is in the feedback path. The quantizer 104 and the DAC 106 are both clocked by a clock signal 108 that has a sampling frequency fs. Typically, the sampling frequency may be higher than the minimum required Nyquist rate such that the sigma-delta modulator 100 is oversampled.

Due to the presence of feedback, the loop filter 102, and the fact that a sigma-delta modulator 100 is usually highly oversampled, the quantization error of the sigma-delta modulator 100 in the signal band of interest is shaped (approximately) according to the inverse of the loop filter 102 characteristic. Also, the quantization error of the quantizer 104 is suppressed in the frequency region where the gain of the loop filter 102 is high. At frequencies where the gain of the loop filter 102 decreases, the quantization noise increases. However, a digital decimation filter (not shown) can be placed at the output of the sigma-delta modulator 100 to filter out the out-of-band quantization noise.

However, as a sigma-delta modulator 100 is a feedback system, it can become increasingly difficult to keep the sigma-delta modulator 100 stable at high sampling frequencies. This may be due to parasitic poles and any additional delays in the circuit, for example caused by the quantizer 104 and/or DAC 106. Another aspect of the sigma-delta modulator 100 (and also the sigma-delta modulator depicted in FIG. 3) is that metastability of the quantizer 104 (and similarly quantizer 304) can cause errors in the system, particularly for very small input signals to the quantizer, which can degrade performance, as discussed below with reference to FIGS. 1A through 4.

To support reliable operation of the sigma-delta modulator 100, quantizer 104 should provide enough gain to enable a digital decision to be made based on a very small signal received from the loop filter 102. Depending on the resolution of the sigma-delta modulator 100 and the specified system bit error rate (BER), the required gain of the quantizer 104 can be, for example, on the order of $10^7$-$10^8$. However, the delay of the quantizer 104 has a direct impact on the stability of the sigma-delta loop. For a continuous-time sigma-delta ADC, the time taken by the quantizer 105 to perform the steps of sampling the input and providing output is limited because the regeneration time is part of the total loop delay for the feedback loop, as shown in FIG. 1A, and the total loop delay is normally no more than one sampling clock period. The time from the quantizer 104 sampling its input signal, to the next block (DAC 106 or its driving circuits) sampling the output V 114 of the quantizer 104, is defined as the regeneration time for the quantizer. The regeneration time of the quantizer is limited, and normally less than one sampling clock period. Indeed, for very high-speed sigma-delta modulators (for example at 10 GHZ to 20 GHz), the maximum allowable delay time of the quantizer 104 may be only 50 ps. The achievable gain of the quantizer 104 is directly related to its available time budget, as discussed with regard to equations 1 and 2 and FIG. 1B below.

For an ideal quantizer, an output value provided by the quantizer should conform to one of a number of permissible, or legal, output values. For simplicity, the example below is described with reference to a 1-bit quantizer. The legal output values in this example are 1 and −1. A transfer function of the ideal 1-bit quantizer is:

$$V_{out} = \begin{cases} 1, & \text{if } V_{in} \geq 0 \\ 1, & \text{if } V_{in} < 0 \end{cases} \qquad \text{Eq. 1}$$

To implement a quantizer with solid-state circuitry, a latch may be used to sense an input signal and to provide an output signal as a logical value (1 or −1). Legal logical values that are at the saturated levels (1 or −1) may be referred to as full-scale values.

FIG. 1B shows a profile of an output voltage $V_{out}$ against an input voltage $V_{in}$ for a 1-bit quantizer with a limited regeneration time. Limiting the regeneration time has the effect that the gain of the latch is also constrained. When an input of a quantizer is very small (close to 0), the output of the quantizer may not reach a full-scale value (legal output 1 or −1), but instead fall at a value between the legal values (e.g. 0.39 or −0.92). The transfer function of the quantizer with limited gain may be express as (assuming the quantizer has a linear gain model):

$$V_{out} = \begin{cases} 1, & \text{if } V_{in} > 1/G \\ G \cdot V_{in}, & \text{if } -1/G \leq V_{in} \leq 1/G \\ -1, & \text{if } V_{in} < -1/G \end{cases} \qquad \text{Eq. 2}$$

FIG. 1B shows a profile of an output voltage $V_{out}$ against an input voltage $V_{in}$ for a 1-bit quantizer with a limited regeneration time and having the transfer function of Equation 2. For positive values of the input voltage $V_{in}$, the output voltage $V_{out}$ increases linearly in a region 150 between 0 V and a voltage representing logical 1 (a full-scale value) as the input voltage $V_{in}$ varies between 0 V and one over the gain of the latch (1/G). Where the input $V_{in}$ is greater than one over the gain of the latch (1/G), the output voltage $V_{out}$ is saturated in a region 152 at the voltage representing logical 1. Similarly, for negative values of the input voltage $V_{in}$, the output voltage $V_{out}$ increases linearly in a region 154 between 0 V and a voltage representing logical −1 (a full-scale value) as the input voltage $V_{in}$ varies between 0 V and minus one over the gain of the latch (−1/G). Where the input voltage $V_{in}$ is more negative than minus one over the gain of the latch (−1/G), the output voltage $V_{out}$ is saturated 156 at the voltage representing logical −1.

As discussed previously with regards to FIG. 1A, the quantizer output V 114 is the input of the DAC 106. In practice, even if the sampled quantizer output is not full-scale, but close to full-scale, the DAC 106 can further resolve it and deliver full-scale output in the feedback path to the adder 112. This effect may be referred to as the gain ($G_{DAC}$) of the DAC 106. The gain ($G_{DAC}$) of the DAC 106 is also limited, and may be substantially lower than the gain of the quantizer ($G_q$). A total loop gain ($G_{loop}$) of the sigma-delta modulator can be considered to be the quantizer gain ($G_q$) multiplied by DAC gain ($G_{DAC}$):

$$G_{loop} = G_q \cdot G_{DAC} \qquad \text{Eq. 3}$$

If the sampled quantizer input is very small ($V_{in} < 1/G_{loop}$), the sampled quantizer output is not full-scale. The (not full-scale) output V 114 of the sigma-delta modulator 100 is typically provided to external digital processing circuitry (not shown). The thresholding and gain applied by the digital processing circuitry has the effect of forcing the output V 114 to a full-scale value. The output of the sigma-delta modulator therefore appears to take a valid digital value from the perspective of down-stream digital electronics. However, for the feedback loop within the sigma-delta modulator 100, the output of the DAC 106 may also not take a full-scale value (−1 or 1), but instead fall at some number between −1 and 1, even after considering the gain of the DAC 106.

The metastability error, $E_{meta}$, is defined as the difference between the actual output V 114 (e.g. −0.92) of the sigma-delta modulator 100 and a corresponding full-scale value V' (e.g. −1):

$$E_{meta} = V' - V \qquad \text{Eq. 4}$$

FIG. 2 illustrates a schematic block diagram of a data processor 200. The data processor 200 comprises a sigma-delta modulator similar to the sigma-delta modulator described previously with reference to FIG. 1A, but includes a delay block 231 associated with the delay of quantizer 204 and the delay of DAC 248. An output V of the sigma-delta modulator is provided to adder 202. The metastability error ($E_{meta}$) 290 may be considered as being introduced by adder 202, as the output V of the quantizer 204 is forced to a full-scale value V', as shown in FIG. 2.

Figure 3:
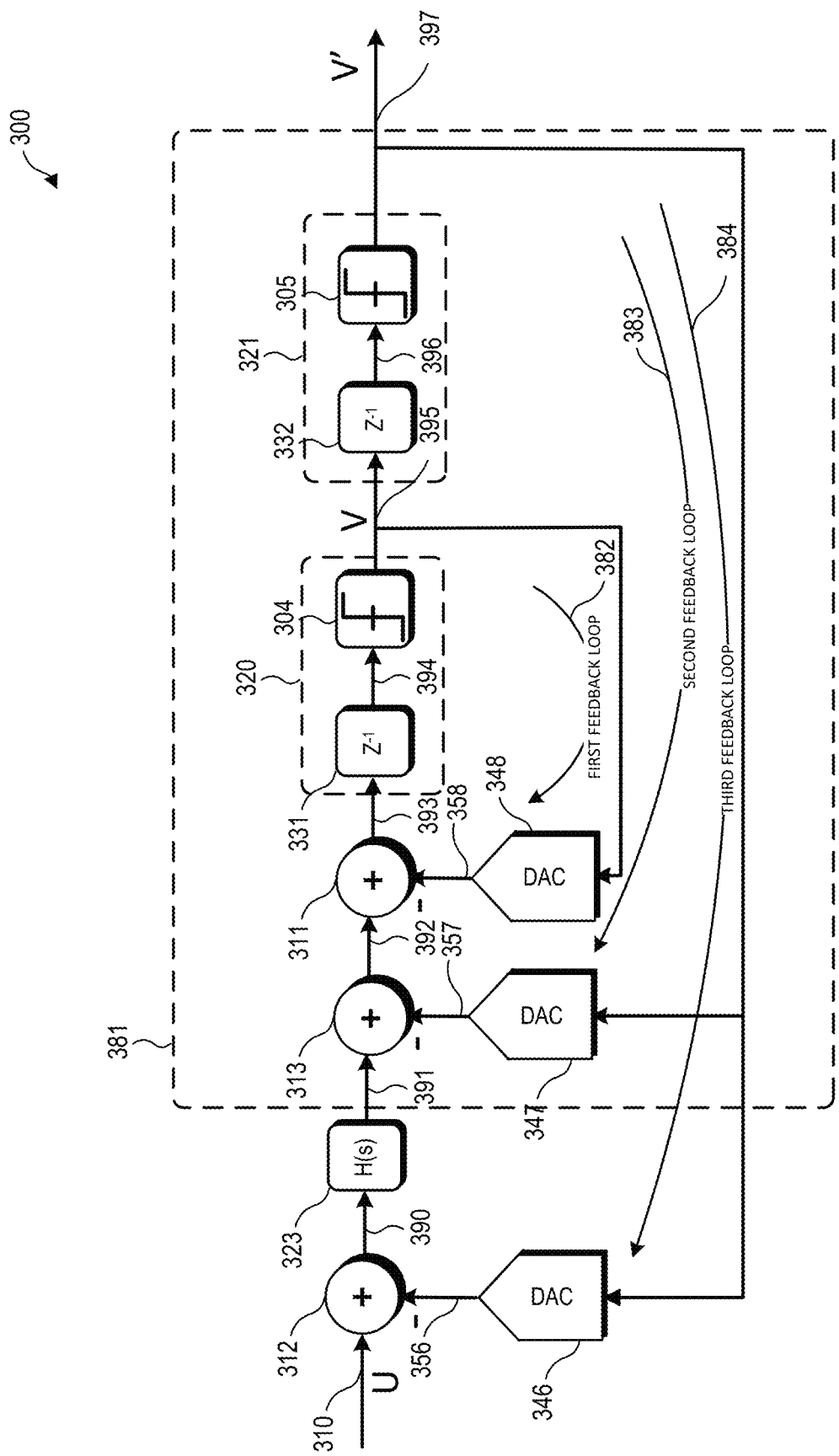
FIG. 3 shows a schematic block diagram of a data processor with a continuous-time sigma-delta ADC having a metastability error compensation module according to various embodiments.

FIG. 3 illustrates a block diagram of a data processor 300 utilizing a metastability error compensation technique according to various embodiments. The data processor 300 includes an adder 312, a digital-to-analog converter (DAC) 346, a loop filter (H(s)) 323, and a metastability error compensation module 381. The metastability error compensation module 381 includes an adder 313, an adder 311, a quantization or analog-to-digital conversion (ADC) module 320, a digital-to-analog converter (DAC) 348, a quantization or analog-to-digital conversion (ADC) module 321, and a digital-to-analog converter (DAC) 347. The quantization module 320 includes a delay block 331 and a quantizer or analog-to-digital converter (ADC) 304. The quantization module 321 includes a delay block 332 and a quantizer 305. In various embodiments, the data processor 300 includes a first quantization module 320 and a second quantization module 321 as part of a metastability error compensation circuit. However, in various embodiments, the metastability error compensation circuit (metastability error compensation module 381) may be extended to include an additional quantizer or a plurality of quantizers with corresponding feedback loops and DACS configured to compensate for the metastability error and the delay caused by the additional quantizers.

As is the case for the sigma-delta modulator 100 of FIG. 1A, for the sigma-delta modulator of FIG. 3, an input U 310 is coupled to a positive input of the adder 312. The output of the adder 312 is coupled to an input of the loop filter (H(s)) 323. The output of the loop filter (H(s)) 323 is coupled to an input of the adder 313.

The adder 313 of error compensation module 381, which is an example of an analog combining circuit, receives the analog output 391 from loop filter 323 and the analog full-scale output 357 from DAC 347. As stated previously, DAC 347 is configured to convert digital output V' 397 from a digital signal to an analog signal. The adder 313 subtracts the analog full-scale output 357 from the analog output 391. Analog output 357, provided to adder 313 from DAC 347, is the analog version of the digital output voltage V' 397 that is provided as the output of quantizer 305. The output of adder 313 (analog output 392), is provided to adder 311 along with analog output 358 from DAC 348.

The adder 311 of first feedback loop 382 receives the analog output 392 from the adder 313 and analog output 358 from DAC 348. The analog output 358 that is provided to adder 311 from DAC 348 is the analog version of the digital output V 395 that is provided as the output of quantizer 304. Adder 311 subtracts the analog output 358 from the analog output 392 to obtain analog output 393, which is provided to quantization module 320.

Quantization module 320, associated with the first feedback loop 382, receives analog output 393. In various embodiments, the delay block 331 of quantization module 320 is indicative of the delay associated with quantizer 304 and DAC 348.

In various embodiments, prior to providing analog output 358 to adder 311, DAC 348 converts the digital output of quantizer 304 of quantization module 320 from digital to analog. The total delay, including, for example, the quantizer delay, the DAC delay, and the propagation delay from the quantizer to the DAC, should be less or equal to one sampling clock period (Ts) of the sigma-delta modulator. Thus, the first feedback loop 382 compensates for the delay of the quantization module 320.

In various embodiments, DAC 348 (and similarly DAC 347) each compensate for the excess loop delay (ELD) in their corresponding feedback loops (e.g., first feedback loop 382 and second feedback loop 383). ELD is defined as the total loop delay that includes, for example, the comparator regeneration time of the quantizers, propagation delay from each quantizer to each DAC (from quantizer 304 to DAC 348 and from quantizer 305 to DAC 347), and the delay of the DAC 347 and DAC 348 in each loop. Thus, subtracting the analog output 358 from the analog output 392 compensates for the delay of the quantizer 304, the propagation delay to the DAC 348, and the delay of DAC 348. Similarly, subtracting the analog output 357 from the analog output 391 compensates for the delay of the quantizer 305, the propagation delay to the DAC 347, and the delay of DAC 347.

For high-speed continuous time sigma-delta ADCs, such as for the data processor 300 depicted in FIG. 3, the ELD (which includes the regeneration time of each comparator) is not negligible compared with the sampling clock period (Ts) of the sigma-delta ADC and therefore is rectified using DAC 348 and DAC 347. That is, the ELD for high-speed sigma-delta ADCs, such as, for example, the quantizers 304 and 305 of data processor 300, is compensated for in order to avoid the detrimental effects of the ELDs, which include, for example, a decreased signal-to-quantization-noise-ratio (SQNR) or an unstable sigma-delta modulator (i.e., the ELD causes the sigma-delta demodulator to become unstable).

In various embodiments, data processor 300 compensates for ELD by implementing a direct feedback loop around each quantizer (first feedback loop 382 for quantizer 332 and second feedback loop 383 for quantizer 305) using the DACs (DAC 348 and 347). That is, the ELD compensation is implemented using, for example, the direct feedback loop around each quantizer through DAC 348 and DAC 347. As depicted in FIG. 3, one sampling clock period ELD (indicated as $z^{-1}$ in the z-domain) for each feedback loop is compensated for using the DAC 348 and DAC 347. Thus, a total delay of two clock periods is compensated for using DAC 348 and DAC 347.

Referring back to quantizer 304, quantizer 304 receives and quantizes the output of adder 311 to generate output V 395. The output V 395 provided at the output of quantizer 304 may be a single voltage representative of a single bit or it may be a plurality of voltages representative of a respective plurality of bits, depending on the configuration of the quantizer 304. For example, the quantizer 304 may be an m-bit (where m-bit means m bits in thermometer/unary code, not m bits in binary code) quantizer (m>2) comprising m−1 pre-amplifiers and m−1 latches, as is known in the art. The pre-amplifiers compare the input of the quantizer 304 with a series of references (which may be reference voltages or reference currents, for example). The latches act on the respective outputs of the pre-amplifiers to provide output signals that represent digital values of the respective m-bits. The output V 395 may include a metastability error, where the output does not conform to a full-scale value due to the input conditions of the quantizer 304 during at least some clock cycles. That is, as discussed previously with reference to the quantizer in FIG. 1A, ideally, the output of the quantizer 304 should take on full-scale output values of −1 or +1 volts. However, the sampled quantizer output is generally not at full-scale values resulting in metastability error, which is, as previously described, the difference between the actual output V 395 (e.g., −0.92) and the full-scale value of output V' 397 (e.g., −1). The output V 395 is provided to quantization module 321.

Quantization module 321 of second feedback loop 383 receives digital output V 395 from quantizer 304. That is, quantizer 304 provides output V 396 to quantizer 305 for metastability error correction.

Quantizer 305 receives the output of quantizer 304 at its input and corrects the metastability error associated with the output V 395. In order to correct the metastability error at the output V 395, the quantizer 305 receives the output V 396 at its input and provides a digital, full-scale output V' 397 at its output. By passing the output V 396 through the quantizer 305, the output V 395 is effectively forced to a full-scale value (a saturated, legal logic value). The reason for this is that the quantizer 305 has further gain, which may be the same gain as the quantizer 304, and so the probability of the "full-scale" output V' 397 not taking a full-scale value is reduced by a factor of the gain. It will be appreciated that the term "full-scale" quantizer 305 refers to the objective of the quantizer and that there may be a non-zero probability that the output of the "full-scale" quantizer 305 does not fall at a full-scale value.

In some examples, the quantizer 305 may differ from the quantizer 304 in that pre-amplifiers may be omitted in the quantizer 305. That is, the quantizer 305 might comprise only m−1 latches. Reference values for the latches of the quantizer 305 may be taken to be the same as those for the quantizer 304. In this case, every latch of the quantizer 305 samples the output of a corresponding latch of the quantizer 304 of the quantization model. Regeneration is performed by the quantizer 305 from these latched values.

In further examples, the quantizer 305 may comprise fewer latches than the quantizer 304. The latch(es) of the quantizer 304 with output that may contain a quantization error are determined dynamically (as is known in the art) and only the output of those latches are re-quantized by the quantizer 305, similar to the approach used in a tracking quantizer. Both the output V 395 of the quantizer 304 and the output V' 397 of the quantizer 305 are converted to analog values using DAC 348 and DAC 347, respectively.

The DAC 348 receives the output V 395 of the quantizer 304 and provides an analog output 358 to adder 311. The DAC 347 receives the full-scale output V' 397 of the quantizer 305 and provides a full-scale analog output 357 to adder 313. The adder 311 receives the analog output 392 and the analog output 358. Similarly, the adder 313 receives the analog output 391 and the analog full-scale output 357 from DAC 347.

As stated previously, the DAC 347 receives the full-scale output V' 397 of the quantizer 305 and provides a full-scale analog output 357. The DAC 348 provides the first feedback loop 382 to adder 311 to perform a delay compensation. The first feedback loop 382 from quantizer 304 of quantization module 320 has an output voltage V 395 that is fed back to the input of quantization module 320 through DAC 348. First feedback loop 382 is a first order feedback loop and is considered the inner ELD compensation loop. The DAC 347 provides the second feedback loop 383 to adder 313 to perform the second delay compensation. The second feedback loop 383 from quantizer 305 of quantization module 321 has the output V' 397 that is fed back to quantizer 320 input through DAC 347, adder 313, and adder 311. The second feedback loop 383 is a second order feedback loop and is referred to as the outer ELD compensation loop.

In various embodiments, the second feedback loop 383 that performs the second delay compensation includes the first delay compensation performed by the first feedback loop 382, thus accounting for the total delay compensation in both the first feedback loop 382 and the second feedback loop 383. That is, the second feedback loop 383 is configured to account for the total delay compensation that occurs in the entire data processor 300. The third feedback loop 384 feeds the output of quantization module 321 through DAC 346 and is the main feedback loop of the sigma-delta modulator that has a stringent requirement on the total quantization gain.

Figure 4:
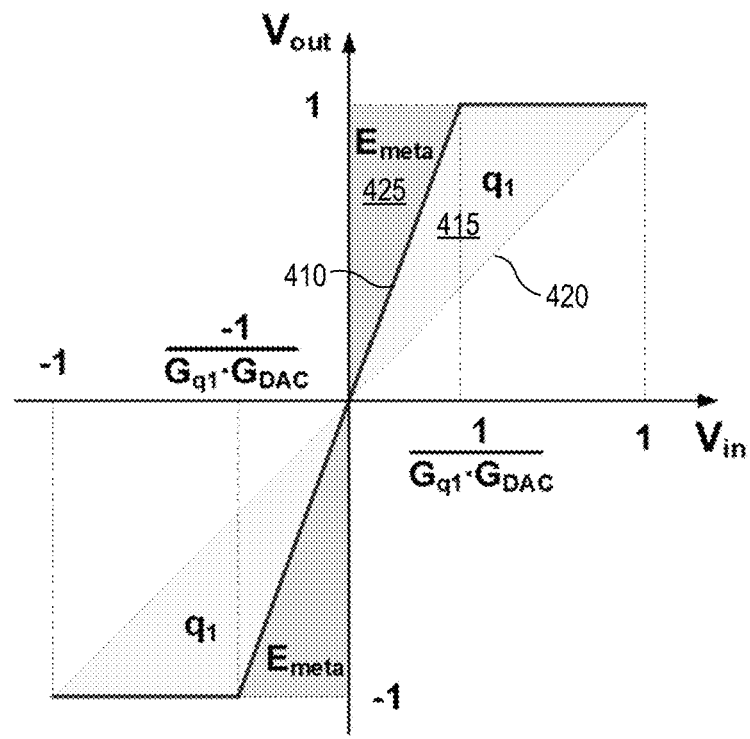
FIG. 4 illustrates the quantization noise and metastability error of the sigma-delta ADC depicted in FIG. 2 according to various embodiments.
Figure 5:
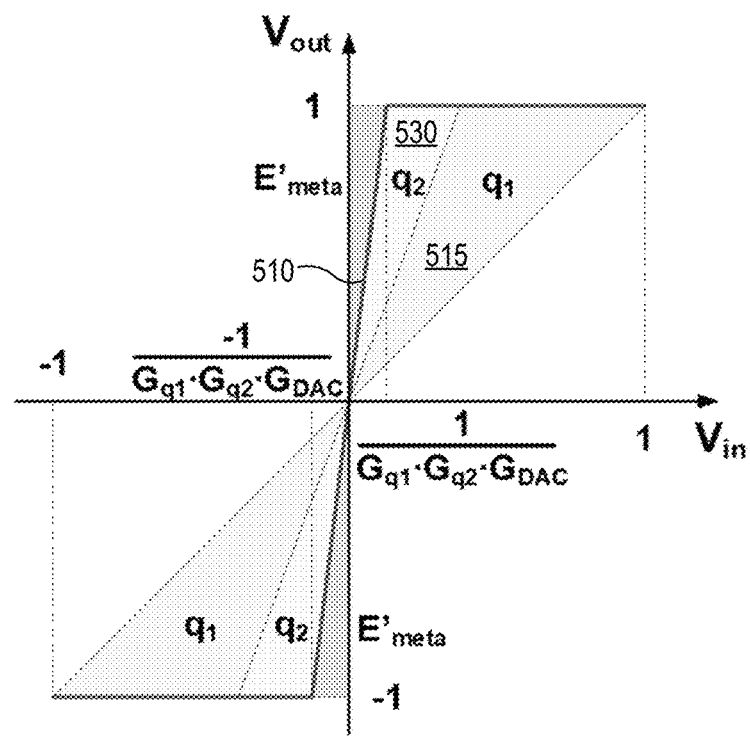
FIG. 5 illustrates the quantization noise and metastability error of the sigma-delta ADC depicted in FIG. 3 according to various embodiments.

FIG. 4 illustrates the quantization noise and metastability error of the sigma-delta ADC depicted in FIG. 2 in accordance with at least one embodiment. FIG. 5 illustrates the quantization noise and metastability error of the sigma-delta ADC associated with the metastability error compensation module 381 of data processor 300 in accordance with at least one embodiment. For the examples depicted in FIGS. 4 and 5, 1-bit quantizers (quantizers 304 and 305) are utilized for the sigma-delta ADC, however, similar results occur for sigma-delta ADCs that utilize multi-bit quantizers. FIGS. 4 and 5 show a profile of an output voltage $V_{out}$ against an input voltage $V_{in}$ for a 1-bit quantizer with a limited generation time.

With reference to FIG. 4, line 410 represents the output characteristic of the quantizer 304 in the sigma-delta modulator of FIG. 3 without the metastability shaping technique shown in FIG. 3. The area 415 between the line 410 and the line 420 (i.e., the line where $V_{out}=V_{in}$) is the quantization error of the quantizer 304, which is also called quantization noise denoted as qt. The area 425 is the metastability error which is denoted as $E_{meta}$. For the sigma-delta ADC associated with FIG. 4, the metastability error occurs with a probability of $1/(G_{q1} \cdot G_{DAC})$. Then, if assuming the input to quantizer 304 is uniformly distributed in the defined input swing $(-1, 1)$, the probability density function of the metastability error is $$f(x)_{meta} = \begin{cases} \dfrac{1}{2G_{1,tot}}, & \text{if } -1 < x < 1 \\ 0, & \text{if else} \end{cases} \quad \text{Eq. 5}$$

where the total gain $G_{1,tot}$ is $$G_{1,tot} = G_{q1} \cdot G_{DAC} \quad \text{Eq. 6}$$

The power of the metastability error (area 425) from the original sigma-delta modulator may be calculated as $$P_{E_{meta}} = \int_{x=-1}^{1} x^2 \cdot \dfrac{1}{2G_{1,tot}} dx = \dfrac{1}{3 \cdot G_{1,tot}} \quad \text{Eq. 7}$$

Similarly, the probability density function of the quantization noise $q_1$ of the quantizer 304 in the sigma-delta modulator is $$f(x)_{q1} = \begin{cases} \dfrac{1}{2 \cdot \left(1 - \dfrac{1}{G_{1,tot}}\right)}, & \text{if } -\left(1 - \dfrac{1}{G_{1,tot}}\right) < x < 1 - \dfrac{1}{G_{1,tot}} \\ 0, & \text{if else} \end{cases} \quad \text{Eq. 8}$$

The power of the quantization noise of the quantizer in the sigma-delta modulator $q_1$ can be calculated as $$P_{q1} = \int_{x=-\left(1-\frac{1}{G_{1,tot}}\right)}^{1-\frac{1}{G_{1,tot}}} x^2 \cdot \dfrac{1}{2 \cdot \left(1 - \dfrac{1}{G_{1,tot}}\right)} dx = \dfrac{1}{3}\left(1 - \dfrac{1}{G_{1,tot}}\right)^2 \quad \text{Eq. 9}$$

Even with relatively low total loop quantizer gain $G_{q1} \cdot G_{DAC}$ (e.g., 40 dB), the power of the metastability error is lower than the quantization noise. However, the quantization noise is in the sigma-delta loop and shaped by the noise transfer function of the quantizer 304. Thus, the in-band quantization noise in the final output is suppressed. The metastability error that is present at the output of the sigma-delta modulator is located directly at the output of the quantizer, which is not shaped. As a result, the power of the metastability error seems to be very low, however, it can still cause dramatic degradation on the overall performance of the sigma-delta ADCs.

FIG. 5 depicts the diagram of the quantization noise and the metastability error of the sigma-delta ADC with metastability shaping technique shown in FIG. 3. The line 510 is the overall output characteristic of the first quantizer (quantizer 304) and the second quantizer (quantizer 305) including the DAC gains (DAC 348 and DAC 347). The area 515 is the quantization error of the quantizer 304 without the additional quantizer 305. The area 530 is the quantization noise of the second quantizer (quantizer 305).

In various embodiments, when the input voltage of the quantizer 304 is within $(1/(G_{q1} \cdot G_{q2} \cdot G_{DAC}), 1/(G_{q1} \cdot G_{DAC}))$ or $(-1/(G_{q1} \cdot G_{DAC}), -1/(G_{q1} \cdot G_{q2} \cdot G_{DAC}))$, the output of DAC 348 has metastability error, and the output of the DAC 346 and DAC 347 do not have metastability error (or have relatively low metastability error) because of the additional quantizer gain $G_{q2}$ of the second quantizer (quantizer 305). Thus, at the output of DAC 346, the metastability error occurs with a probability of $1/(G_{q1} \cdot G_{q2} \cdot G_{DAC})$, which is $G_{q2}$ times lower than the conventional sigma-delta ADC. The power of the metastability error $E'_{meta}$ at the output of the DAC 346 can be calculated as $$P_{E'_{meta}} = \frac{1}{3 \cdot G_{2,tot}} \quad \text{Eq. 10}$$

where the total gain $G_{2,tot}$ is $$G_{2,tot} = G_{q1} \cdot G_{q2} \cdot G_{DAC} \quad \text{Eq. 11}$$

The probability density function of the quantization noise $q_2$ of the second quantizer (quantizer 305) is $$f(x)_{q2} = \begin{cases} \dfrac{1}{2G_{1,tot} \cdot \left(1 - \dfrac{1}{G_{q2}}\right)}, & \text{if } -\left(1 - \dfrac{1}{G_{q2}}\right) < x < 1 - \dfrac{1}{G_{q2}} \\ 0, & \text{if else} \end{cases} \quad \text{Eq. 12}$$

The power of the quantization noise of the quantizer 305 is $$P_{q2} = \frac{1}{3 \cdot G_{1,tot}} \cdot \left(1 - \frac{1}{G_{q2}}\right)^2 \quad \text{Eq. 13}$$

The metastability error $E_{meta}$, depicted in FIG. 4, may now be divided into two parts, $q_2$ and $E'_{meta}$, with reference to the sigma-delta ADC of FIG. 3 with metastability error compensation module 381:

$$E_{meta} = q_2 + E'_{meta} \quad \text{Eq. 14}$$

Figure 6:
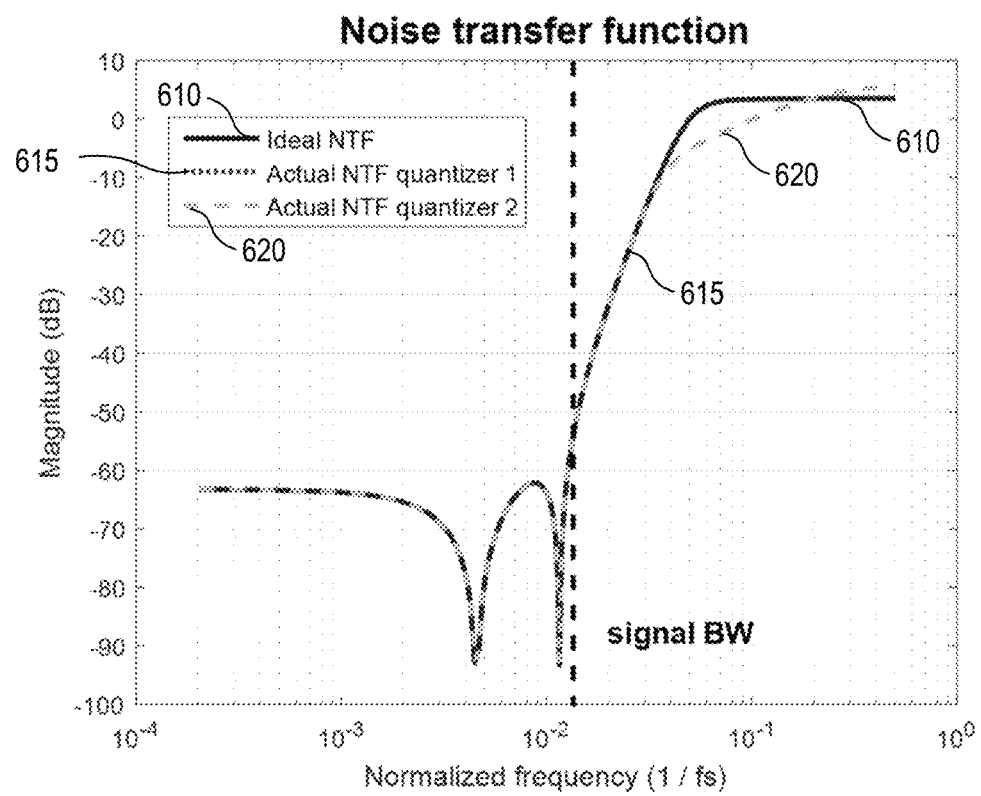
FIG. 6 illustrates the noise transfer functions associated with the continuous-time sigma-delta ADC with a metastability error compensation module of FIG. 3 according to various embodiments.

FIG. 6 illustrates the noise transfer functions associated with quantizer 304 and quantizer 305 of FIG. 3 compared to an ideal noise transfer function according to various embodiments. Both of the quantization noises, $q_1$ and $q_2$, of quantizer 304 and quantizer 305, respectively, are shaped by a full-order noise transfer function, as depicted in FIG. 6. As it relates to the noise transfer functions, full-order means the same order as the loop filter 323 of FIG. 3. The line 610 shows the ideal noise transfer function (NTF) of the conventional sigma-delta modulator. The dotted line 615 depicts the actual NTF of the quantization noise $q_1$ of the quantizer 304, which approximates to the ideal NTF. The dashed line 620 depicts the actual NTF of the quantization noise $q_2$ of the quantizer 305. The in-band part of the actual NTF of the quantization noise $q_2$ is overlapped with the ideal NTF, while the high-frequency portion of the actual NTF displays a minor difference, as can be seen in FIG. 6. The out-of-band gain of the actual NTF of the quantization noise $q_2$ is slightly higher than the ideal NTF, but does not impact the stability of the sigma-delta modulator, because the power of the quantization noise $q_2$ of quantizer 305 is much lower than the quantization noise $q_1$ of quantizer 304.

Figure 7:
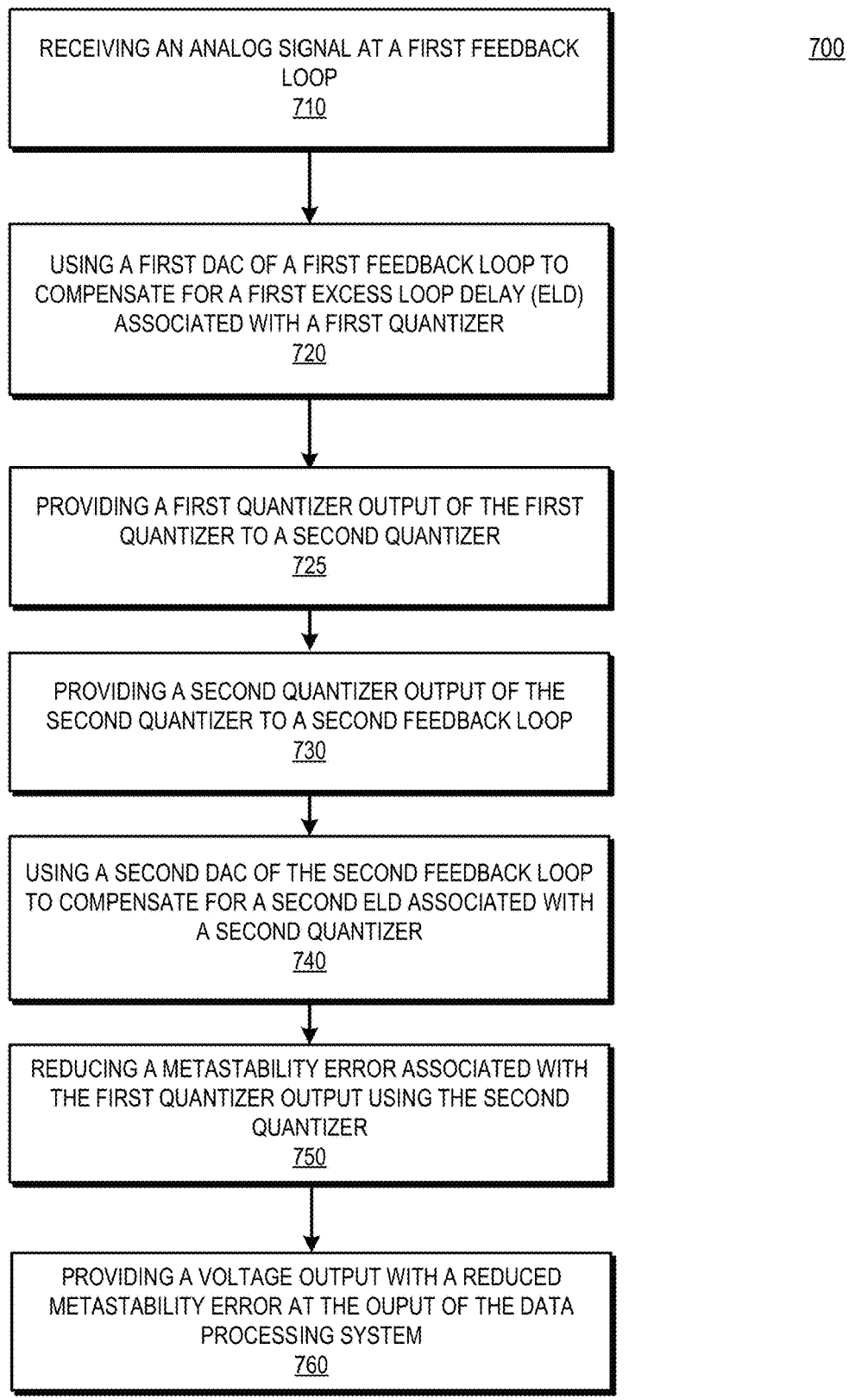
FIG. 7 illustrates a method of operating a data processor using metastability error compensation according to various embodiments.

FIG. 7 illustrates a method 700 of operating a data processor using metastability error compensation according to various embodiments. With reference to FIG. 3, at block 710, an analog signal (analog output 392) is received at first feedback loop 382. At block 720, DAC 348 is used to compensate for a first excess loop delay (ELD) that is associated with the first quantizer 304. At block 725, the first quantizer output 395 is provided to the second quantizer 305. At block 730, the second quantizer output (output V 397) is provided to the DAC 347 of the second feedback loop 383. At block 740, the DAC 347 of the second feedback loop 383 is used to compensate for the second ELD associated with the quantizer 305 and the second DAC 347. At block 750, the metastability error associated with the first quantizer output (output V 395) is reduced using the second quantizer 305. At block 760, a voltage output (output V' 397) is provided at the output of data processor 300 with a reduced metastability error.

Figure 8:
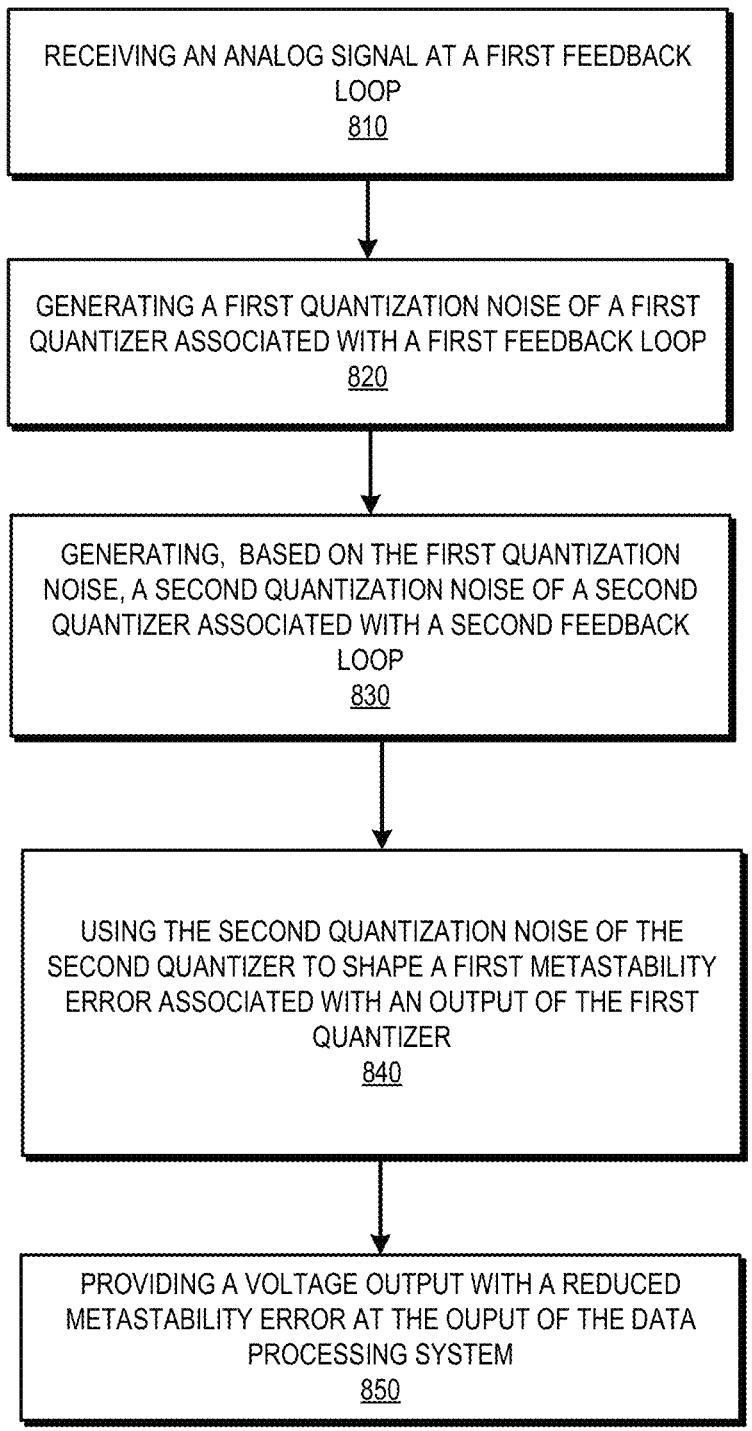
FIG. 8 illustrates a method of operating a data processor using metastability error compensation according to various embodiments.

FIG. 8 illustrates a method 800 of operating a data processor using metastability error compensation according to various embodiments. With reference to FIGS. 3 and 5, at block 810, an analog signal (analog output 392) is received at the first feedback loop 382. At block 820, the first quantization noise $q_1$ (depicted in FIG. 5) of quantizer 304 associated with first feedback loop 382 is generated. At block 830, based on the first quantization noise, a second quantization noise $q_2$ of a second quantizer 305 associated with second feedback loop 383 is generated. At block 840, the second quantization noise $q_2$ of the second quantizer 305 is used to shape a first metastability error $E_{meta}$ associated with the output of the first quantizer 304 (output V 395). At block 850, a voltage output (output V' 397) is provided at the output of data processor 300 with a reduced metastability error.

In various embodiments, although the loop filter 323 in FIG. 3 is depicted using a feed-forward structure, other structures including, for example, a feedback structure or a combined feed-forward/feedback structure may be utilized for the metastability shaping technique depicted in FIG. 3. Also, although a 1-bit quantizer has been chosen to present the metastability shaping technique, multi-bit quantizers may also be used for metastability shaping technique depicted in FIG. 3. In various embodiments, a multi-stage noise shaping (MASH) sigma-delta modulator or cascaded sigma-delta modulator may be used as the sigma-delta modulator depicted in FIG. 3.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method, comprising:
using a first feedback loop to compensate for a first excess loop delay (ELD) associated with a first quantizer;
providing a first quantizer output of the first quantizer to a second feedback loop, the second feedback loop compensating for a second ELD associated with a second quantizer, the second quantizer reducing a metastability error associated with the first quantizer output; and
feeding the output of the second quantizer through a third DAC of a third feedback loop, the third feedback loop having a total quantization gain.

2. The method of claim 1, wherein:
a first digital-to-analog converter (DAC) output provided by a first DAC of the first feedback loop is configured to compensate for a first quantizer delay; and
a second DAC output provided by a second DAC of the second feedback loop is configured to compensate for a second quantizer delay.

3. The method of claim 1, further comprising:
converting the first quantizer output of the first quantizer to an analog signal using the first DAC; and
converting a second quantizer output of the second quantizer to a second analog signal using the second DAC.

4. The method of claim 3, further comprising:
converting the second quantizer output of the second quantizer to a third analog signal using a third DAC.

5. The method of claim 4, further comprising:
using a third adder to subtract the third analog signal from a first input to the third adder.

6. The method of claim 1, further comprising:
subtracting a first DAC output from a second feedback loop adder output using a first feedback loop adder.

7. The method of claim 1, further comprising:
subtracting a first DAC output from a second feedback loop adder output using a first feedback loop adder; and
subtracting a second DAC output from a loop filter output to generate the second feedback loop adder output.

8. The method of claim 1, wherein:
the total quantization gain includes a first gain of the first quantizer, a second gain of the second quantizer, and a third gain of the third DAC.

9. An apparatus, comprising:
a first feedback loop having a first digital-to-analog-converter (DAC) coupled to a first quantizer, a first DAC output provided by the first DAC of the first feedback loop is configured to compensate for a first quantizer delay;
a second feedback loop having a second DAC coupled to a second quantizer, a second DAC output provided by the second DAC is configured to compensate for a second quantizer delay, wherein the first DAC is coupled to the first quantizer to compensate for a first excess loop delay (ELD) associated with the first quantizer, the second DAC is coupled to the second quantizer to compensate for a second excess loop delay (ELD) associated with the second quantizer, and the second quantizer reduces a metastability error associated with an output of the first quantizer; and
a third feedback loop, wherein the output of the second quantizer is fed through a third DAC of the third feedback loop, the third feedback loop having a total quantization gain.

10. The apparatus of claim 9, wherein:
the total quantization gain includes a first gain of the first quantizer, a second gain of the second quantizer, and a third gain of the third DAC.

11. The apparatus of claim 10, wherein:
the output of the first quantizer is converted to an analog signal using the first DAC; and
the output of the second quantizer is converted to a second analog signal using the second DAC.

12. The apparatus of claim 11, wherein:
the first quantizer and the second quantizer are at least one of a single-bit or multi-bit quantizer.

13. The apparatus of claim 9, further comprising:
a first feedback loop adder configured for subtracting the first DAC output from a second feedback loop adder output; and
the second feedback loop adder configured for subtracting the second DAC output from a loop filter output to generate the second feedback loop adder output.

14. The apparatus of claim 13, further comprising:
a third feedback loop adder configured for subtracting a third DAC output from a first input of the third feedback loop adder.

15. A method, comprising:
generating a first quantization noise of a first quantizer associated with a first feedback loop;
generating, based on the first quantization noise of the first quantizer, a second quantization noise of a second quantizer associated with a second feedback loop; and
using the second quantization noise of the second quantizer to shape a first metastability error associated with an output of the first quantizer, the using the second quantization noise comprising subtracting the second quantization noise of the second quantizer from the first metastability error to generate a second metastability error.

16. The method of claim 15, wherein:
the second metastability error is a reduced metastability error compared to the first metastability error.

17. The method of claim 15, wherein:
using a first gain of the first quantizer and a second gain of the second quantizer to generate a power of the second quantization noise.

18. The method of claim 15, wherein:
the second quantizer is a full-scale quantizer.

19. A method, comprising:
using a first feedback loop to compensate for a first excess loop delay (ELD) associated with a first quantizer;
providing a first quantizer output of the first quantizer to a second feedback loop, the second feedback loop compensating for a second ELD associated with a second quantizer, the second quantizer reducing a metastability error associated with the first quantizer output;
converting the first quantizer output of the first quantizer to an analog signal using the first DAC;
converting a second quantizer output of the second quantizer to a second analog signal using the second DAC; and
converting the second quantizer output of the second quantizer to a third analog signal using a third DAC.

20. A method, comprising:
using a first feedback loop to compensate for a first excess loop delay (ELD) associated with a first quantizer;
providing a first quantizer output of the first quantizer to a second feedback loop, the second feedback loop compensating for a second ELD associated with a second quantizer, the second quantizer reducing a metastability error associated with the first quantizer output;
subtracting a first DAC output from a second feedback loop adder output using a first feedback loop adder; and
subtracting a second DAC output from a loop filter output to generate the second feedback loop adder output.

* * * * *